United States Patent
Wang et al.

(10) Patent No.: US 7,795,644 B2
(45) Date of Patent: Sep. 14, 2010

(54) INTEGRATED CIRCUITS WITH STRESS MEMORY EFFECT AND FABRICATION METHODS THEREOF

(75) Inventors: Mei-Yun Wang, Hsinchu (TW);
Cheng-Chen Hsueh, Taipei (TW);
Wu-An Weng, Hsinchu (TW)

(73) Assignee: Taiwan Semiconductor Manufacturing Co., Ltd., Hsin-Chu, Taiwan (CN)

( * ) Notice: Subject to any disclaimer, the term of this patent is extended or adjusted under 35 U.S.C. 154(b) by 274 days.

(21) Appl. No.: 11/649,282

(22) Filed: Jan. 4, 2007

(65) Prior Publication Data

US 2008/0164530 A1 Jul. 10, 2008

(51) Int. Cl.
*H01L 21/8238* (2006.01)

(52) U.S. Cl. ............... 257/206; 438/142; 438/199; 257/E27.108

(58) Field of Classification Search ........... 438/142; 257/206, E21.108
See application file for complete search history.

(56) References Cited

U.S. PATENT DOCUMENTS 6,894,356 B2 * 5/2005 Choi ............ 257/393

| 7,223,647 | B2 | 5/2007 | Hsu et al. | |
|---|---|---|---|---|
| 2004/0046212 | A1* | 3/2004 | Takahashi | 257/390 |
| 2004/0232494 | A1* | 11/2004 | Nagano et al. | 257/382 |
| 2005/0269650 | A1 | 12/2005 | Pidin | |
| 2007/0020838 | A1* | 1/2007 | Zhu et al. | 438/199 |
| 2007/0105299 | A1* | 5/2007 | Fang et al. | 438/199 |

FOREIGN PATENT DOCUMENTS

CN 1770425 A 5/2006

* cited by examiner

*Primary Examiner*—Thao X Le
*Assistant Examiner*—Matthew Gordon
(74) *Attorney, Agent, or Firm*—Birch, Stewart, Kolasch & Birch, LLP

(57) ABSTRACT

Semiconductor devices with selective stress memory effect and fabrication methods thereof. The semiconductor device comprises a semiconductor substrate with a first region and a second region. Both the first region and the second region have a first doped region and a second doped region separated by an insulation layer. A PMOS transistor is disposed on the first doped region layer. An NMOS transistor is disposed on the second doped region. A first capping layer is disposed covering the NMOS transistor over the first region. A second capping layer is disposed covering the PMOS transistor over the first region. The thickness of the first capping layer is different from the thickness of the second capping layer, thereby different stress is induced on the PMOS transistor and the NMOS transistor respectively. The PMOS transistor and the NMOS transistor over the second region are silicided.

12 Claims, 14 Drawing Sheets

INTEGRATED CIRCUITS WITH STRESS MEMORY EFFECT AND FABRICATION METHODS THEREOF

BACKGROUND OF THE INVENTION

1. Field of the Invention

The invention relates to microelectronic semiconductor devices, and more particularly to methods for fabricating semiconductor devices with selective stress memory effect thereon.

2. Description of the Related Art

Semiconductor fabrication techniques, such as stress memory technique (SMT) and selective stress memory technique (SSMT) can be adopted after S/D implantation to induce stress in MOSFET channel, thereby improving device performance for advanced technologies (e.g. 65 nm generations or beyond). The SMT or SSMT consists of gate polysilicon recrystallization under a stress capping layer using S/D annealing, leading to an improved NMOS performance of 6-10%. Depending on the materials utilized, it may be necessary to remove the capping layer on the PMOS before S/D annealing.

Conventional SMT process uses stressed film deposition and S/D annealing to apply the stress to the substrate. The stressed film is then removed prior to subsequent processes. Alternatively, different stresses, generated by different capped layers with different thicknesses, referred to as selective stress memory technique (SSMT), may be respectively applied to an NMOS field effect transistor and a PMOS field effect transistor. Some devices require a resist protection oxide (RPO) layer to define silicide and non-silicide regions. The RPO process is performed subsequent to the SSMT process but prior to the silicide process.

FIGS. 1A-1H are cross sections illustrating fabrication of a conventional semiconductor device with selective stress memory effect. In FIG. 1A, a semiconductor substrate 10 including a bulk silicon substrate or a silicon-on-insulator (SOI) substructure is provided. The substrate 10 preferably includes a monocrystalline silicon substrate doped to a p-well for an NMOS device 100N or to an n-well for a PMOS device 100P. The substrate 10 has a first well of the first conductivity and a second well of the second conductivity. The first well and the second well are isolated from one another by shallow trench isolation (STI) 45 in the substrate 10 to separate PMOS transistor 100P from NMOS transistor 100N. Gate dielectric 15 is deposited on the surface of the semiconductor substrate 10 over both the PMOS transistor 100P and the NMOS transistor 100N. Gate electrode 20 such as doped silicon is deposited and formed on gate dielectric 15 over both the PMOS transistor 100P and the NMOS transistor 100N. Insulating sidewall spacers such as oxide-nitride-oxide (ONO) structures 32, 34, and 36 are formed on the sidewalls of the gate electrode 20 over both the PMOS transistor 100P and the NMOS transistor 100N. Ion implantation 50 is performed to create source 44 and drain 42 in the substrate 10. The source 44 and drain 42 over the PMOS transistor 100P are inverted doping types corresponding to those over the NMOS transistor 100N.

Referring to FIG. 1B, a first dielectric layer 60 and a second dielectric layer 65 are sequentially formed on the substrate over both the PMOS transistor 100P and the NMOS transistor 100N.

Referring to FIG. 1C, a mask (not shown) is disposed over the NMOS transistor 100N, thereby exposing the second dielectric layer 65 over the PMOS transistor 100P. An etching process is performed to thin the exposed second dielectric layer 65. Different stresses are thus selectively generated over either the PMOS transistor 100P or the NMOS transistor 100N.

Referring to FIG. 1D, the second dielectric layer 65 is removed by wet etching or dry etching. The first dielectric layer 60 is sequentially removed by wet etching. The ONO or ON sidewalls are undercut as the first dielectric layer 60 is etched, creating a recess 38a, as shown in FIG. 1E.

To meet device requirements, a resist protection oxide (RPO) layer is sometimes provided to define silicide and non-silicide regions. The RPO process is performed after the SMT or SSMT process but before the metal silicide process. For example, some semiconductor devices comprise a main region for a memory matrix and a peripheral region for logic control. The peripheral logic region must be silicidized to reduce contact resistance, while silicidization of the main region is not necessary.

FIGS. 1F-1H show cross sections illustrating a silicidization process over the main region. Referring to FIG. 1F, a passivation layer 70 is conformably formed on the substrate 10 over both the PMOS transistor 100P and the NMOS transistor 100N. The passivation layer 70 over the peripheral logic region desirable for carrying out silicidization is removed, while the passivation layer 70 covering the main region remains.

A mask (not shown) is disposed over the main region and the exposed passivation layer over the peripheral logic region is removed. The exposed passivation layer is etched by wet etching, resulting in further undercut of the ONO or ON sidewalls creating a second recess 38b, as shown in FIG. 1G.

Referring to FIG. 1H, a metal silicide layer 80 is formed over both the PMOS transistor 100P and the NMOS transistor 100N of the peripheral logic region. The metal silicide layer 80 is formed directly contacting the gate electrode 20 and source 42 and drain region 44.

Although a conventional SMT process can improve device performance by applying a stress thereon, the additional process will result in higher fabrication cost and reducing the process window or margin. The higher fabrication cost results from the cost of the additional process steps (e.g., SMT/SSMT film deposition or removal, RPO deposition and removal). The process window or margin will be reduced due to the multi-step film deposition and etching process possibly resulting in higher leakage current induced by a severe STI divot and spacer undercut.

BRIEF SUMMARY OF THE INVENTION

The invention is directed to semiconductor devices fabricated by a selective stress memory technique (SSMT). The semiconductor devices comprise a main region for a memory matrix and a peripheral region for logic control. The peripheral logic region requires silicidization to reduce contact resistance, while the main region does not require silicidization. Thus, a resist protective oxide (RPO) process required by conventional SMT or SSMT methods is omitted, reducing manufacturing cost and improving device performance.

The invention provides a semiconductor device with selective stress memory effect thereon, comprising a semiconductor substrate with a first region and a second region. Both the first region and the second region have a first doped region and a second doped region separated by an insulation layer. A PMOS transistor is disposed on the first doped region layer. An NMOS transistor is disposed on the second doped region. A first capping layer is disposed covering the NMOS transistor over the first region. A second capping layer is disposed covering the PMOS transistor over the first region. The thickness of the first capping layer is different from the thickness of the second capping layer, thereby different stress is induced on the PMOS transistor and the NMOS transistor respectively. The PMOS transistor and the NMOS transistor over the second region are silicidized.

The invention further provides a method for fabricating a semiconductor device with selective stress memory effect thereon, comprising providing a semiconductor substrate with a first region and a second region. Both the first region and the second region have a first doped region and a second doped region separated by insulation. A PMOS transistor is formed on the first doped region layer and an NMOS transistor is formed on the second doped region. A silicon oxide layer is formed covering the NMOS transistor and the PMOS transistor. A silicon nitride layer on the silicon oxide layer is formed. Part of the silicon nitride layer overlying the PMOS transistor is thinned. A portion of the silicon oxide layer and the silicon nitride layer over the second region are removed the PMOS transistor and the NMOS transistor over the second region are silicidized.

The invention further provides a method for fabricating a semiconductor device with selective stress memory effect thereon, comprising: providing a semiconductor substrate with a first region and a second region, both the first region and the second region have a first doped region and a second doped region separated by an insulation; forming a PMOS transistor on the first doped region layer and an NMOS transistor on the second doped region; forming a silicon oxide layer covering the NMOS transistor and the PMOS transistor over both the first and the second regions; forming a silicon nitride layer on the silicon oxide layer; thinning part of the silicon nitride layer overlying the PMOS transistor over both the first and the second regions; annealing the semiconductor substrate, thereby inducing different stress on the PMOS transistor and the NMOS transistor respectively; removing the silicon oxide layer and the silicon nitride layer over the second region, and silicidizing the PMOS transistor and the NMOS transistor over the second region.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The process of forming the previously described semiconductor device with selective stress memory effect is shown in FIGS. 2A-2F.

Figure 1A:
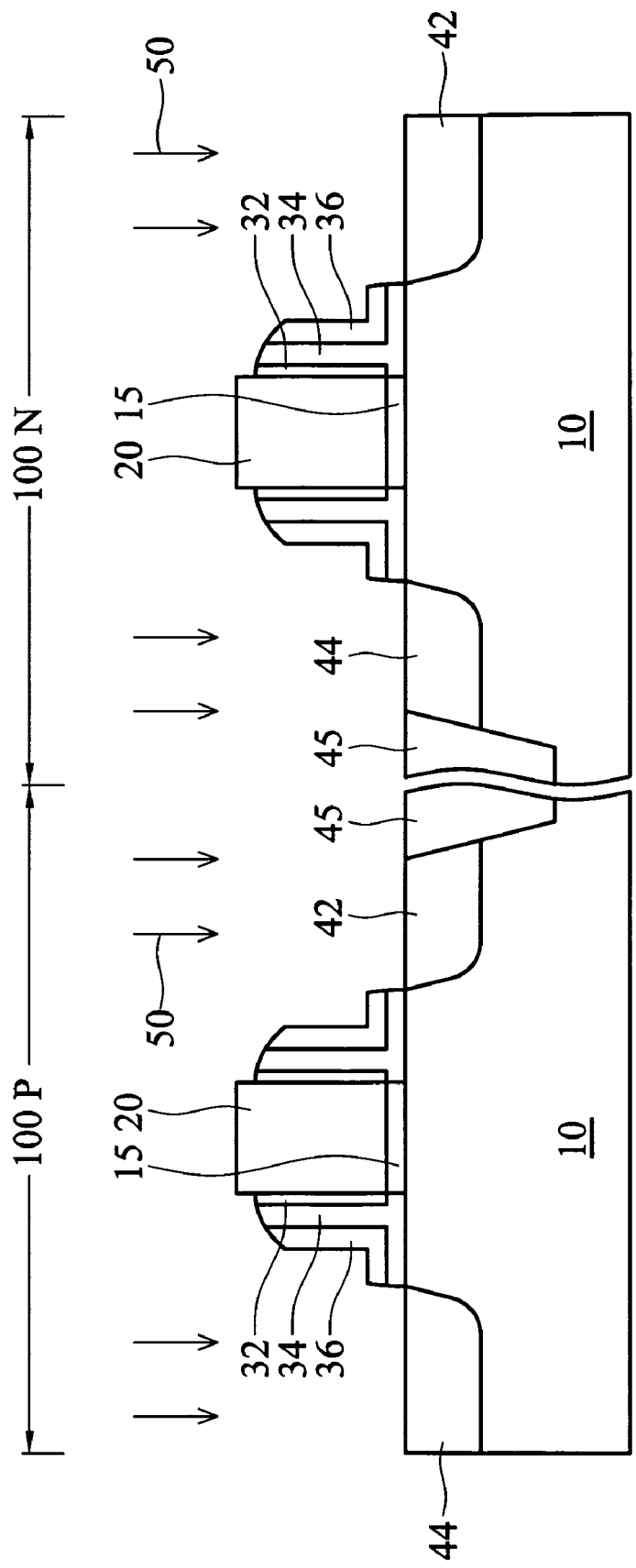
FIGS. 1A-1H are cross sections illustrating fabrication of a conventional semiconductor device with selective stress memory effect.
Figure 1B:
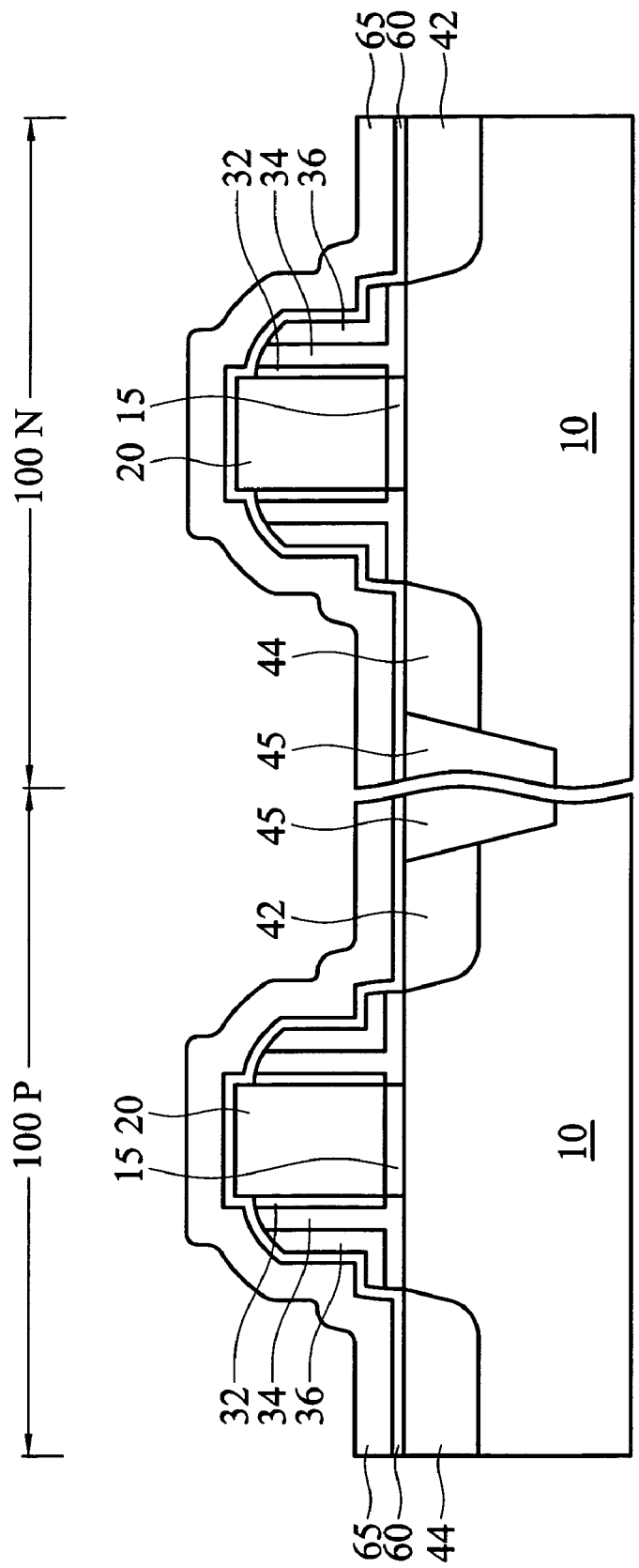
Figure 1C:
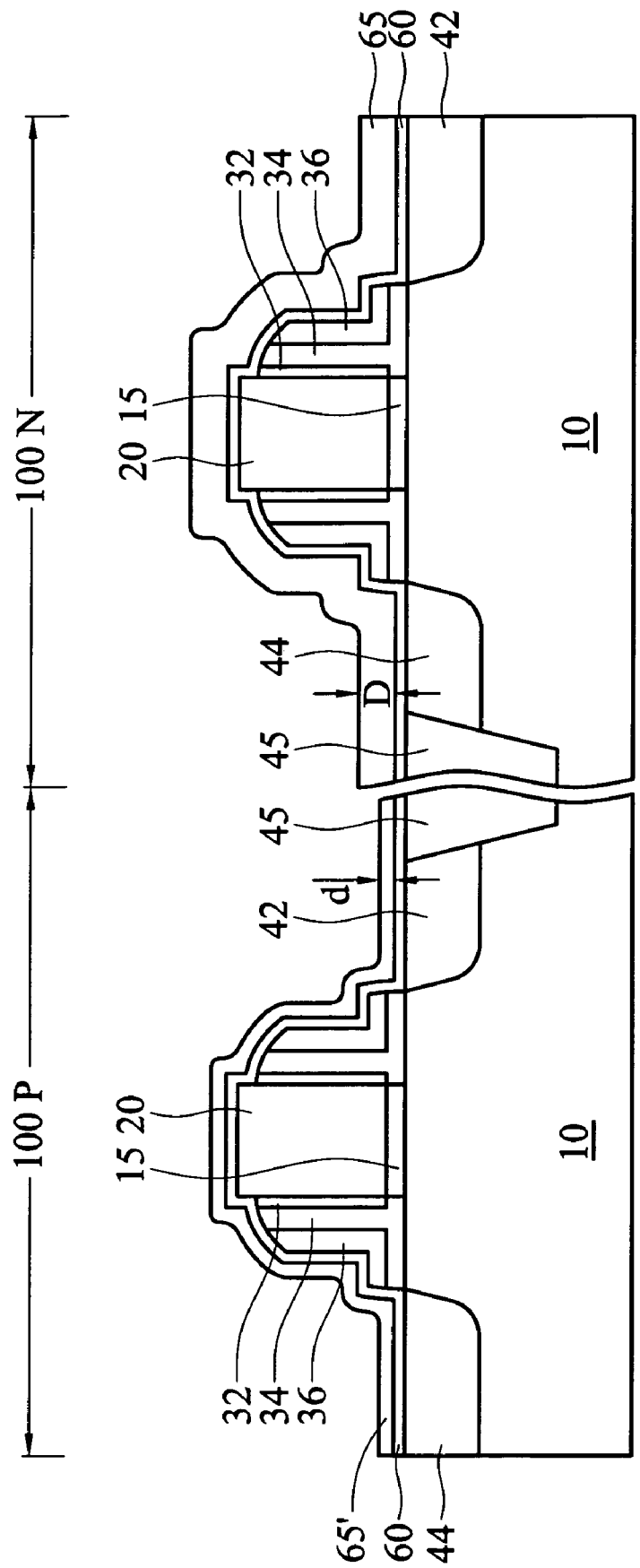
Figure 1D:
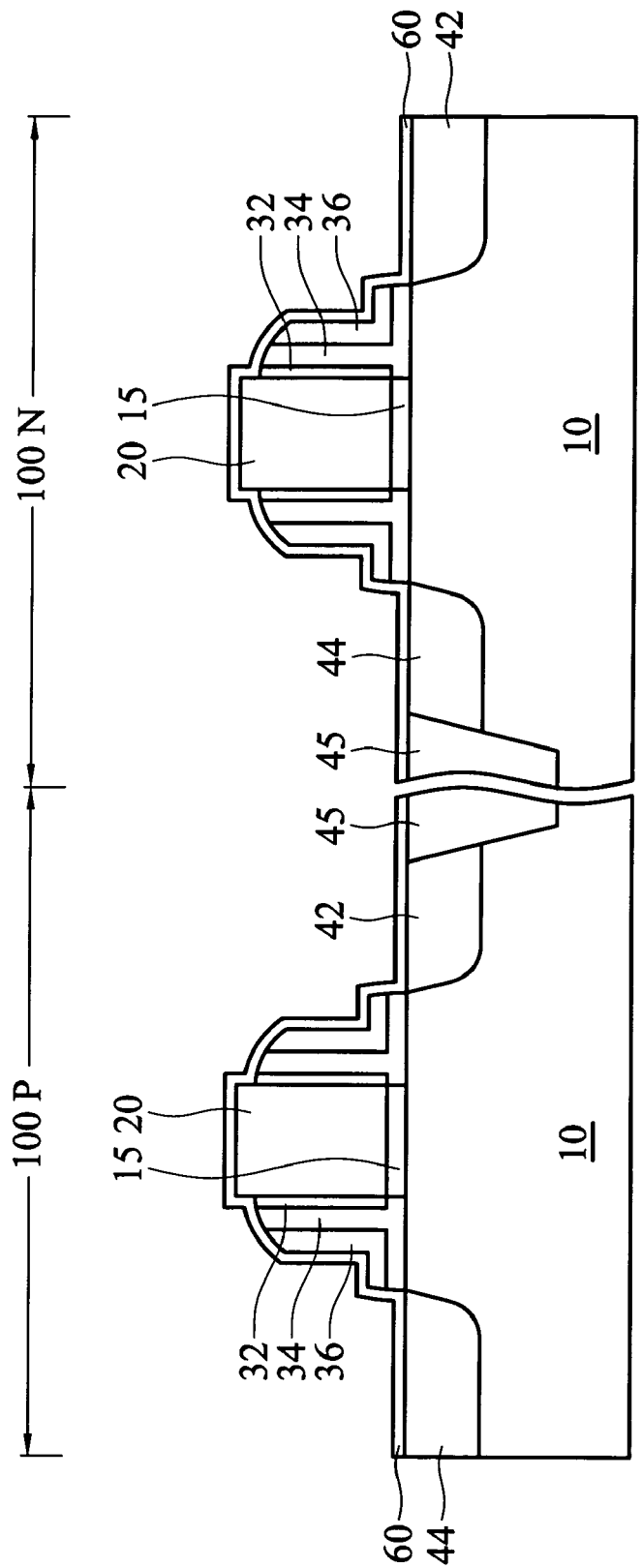
Figure 1E:
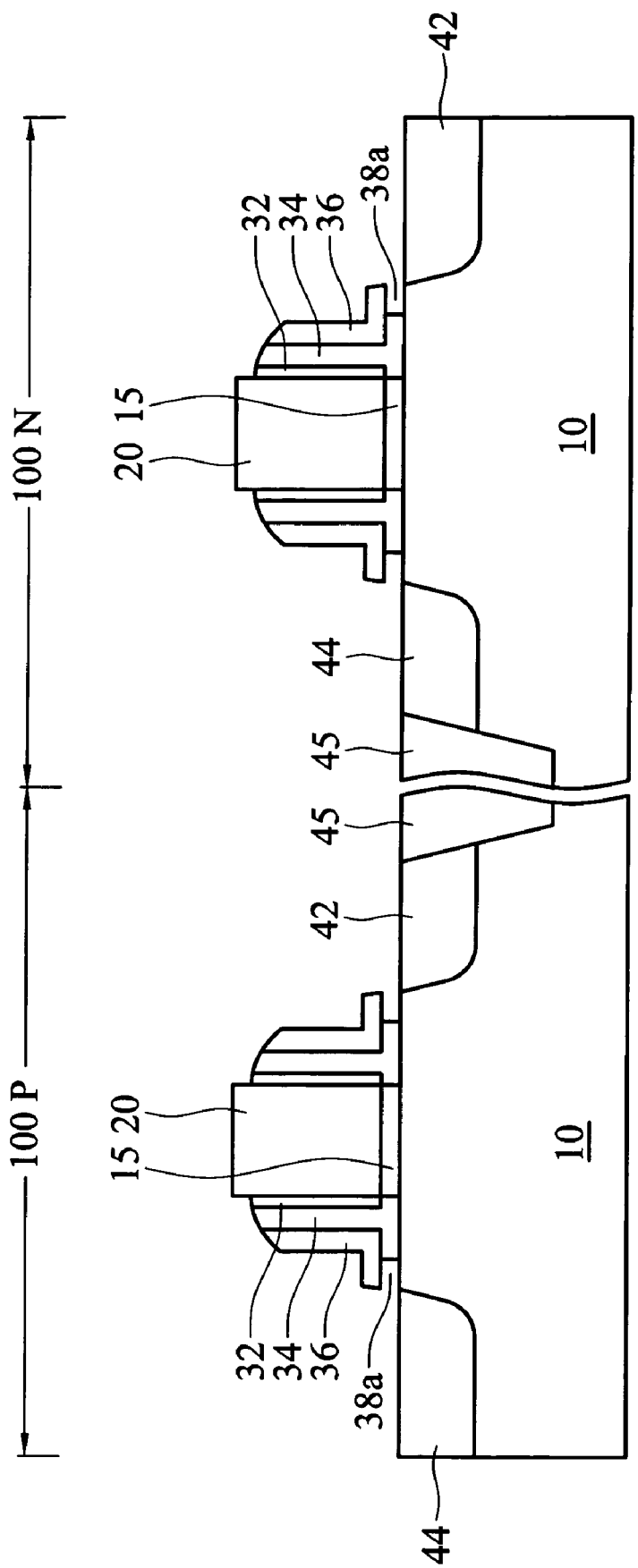
Figure 1F:
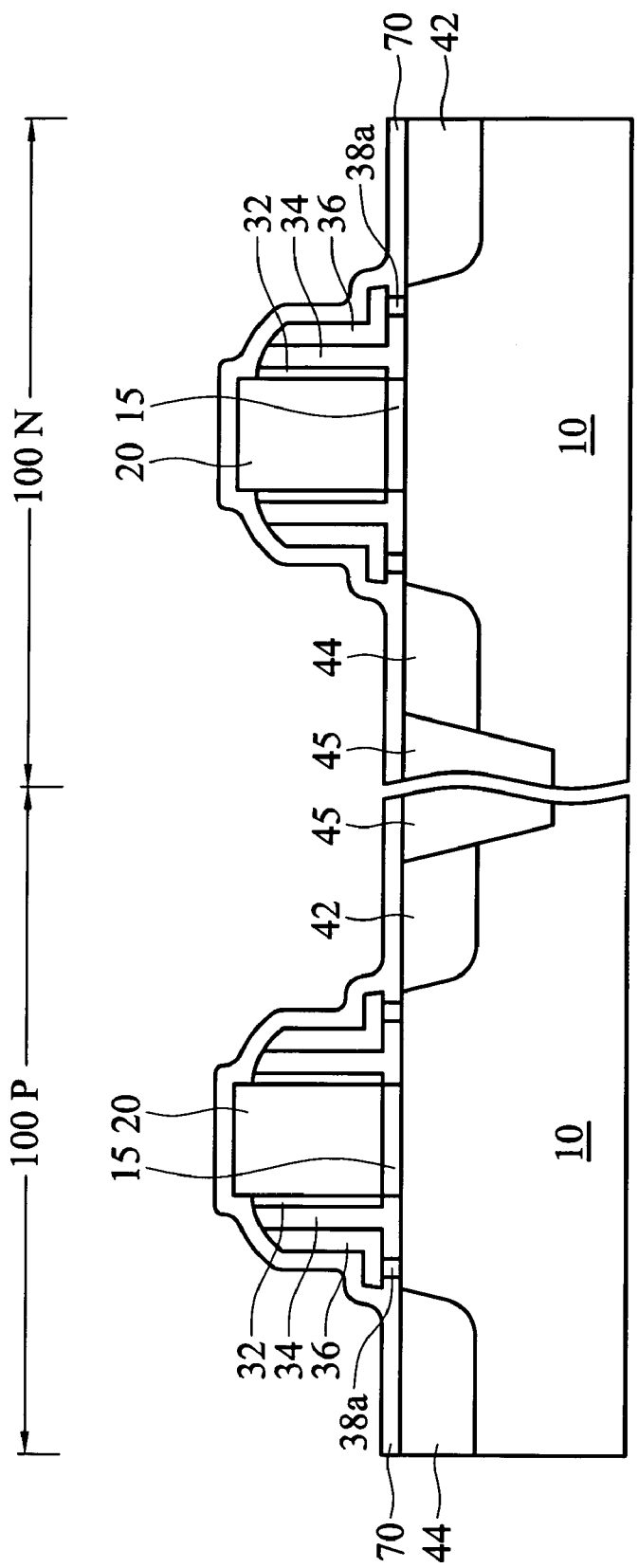
Figure 1G:
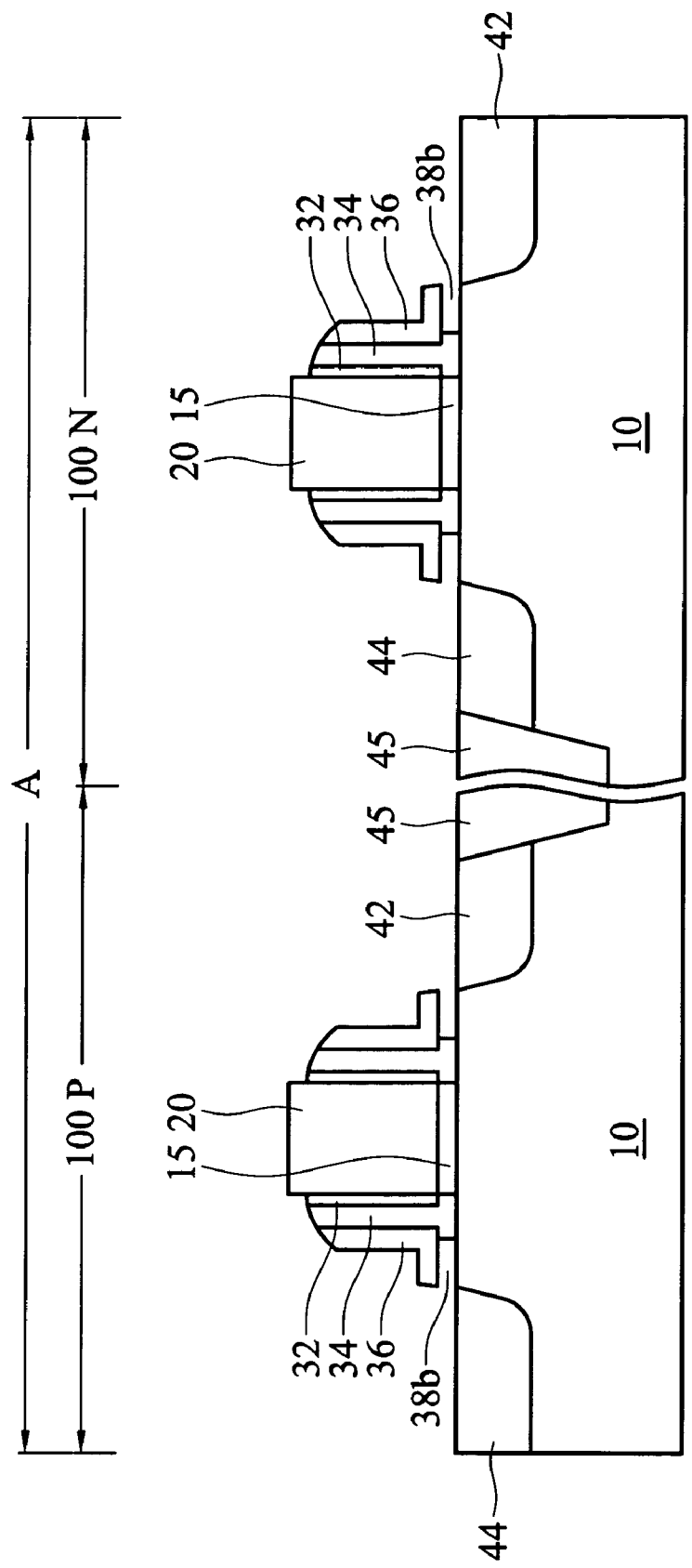
Figure 1H:
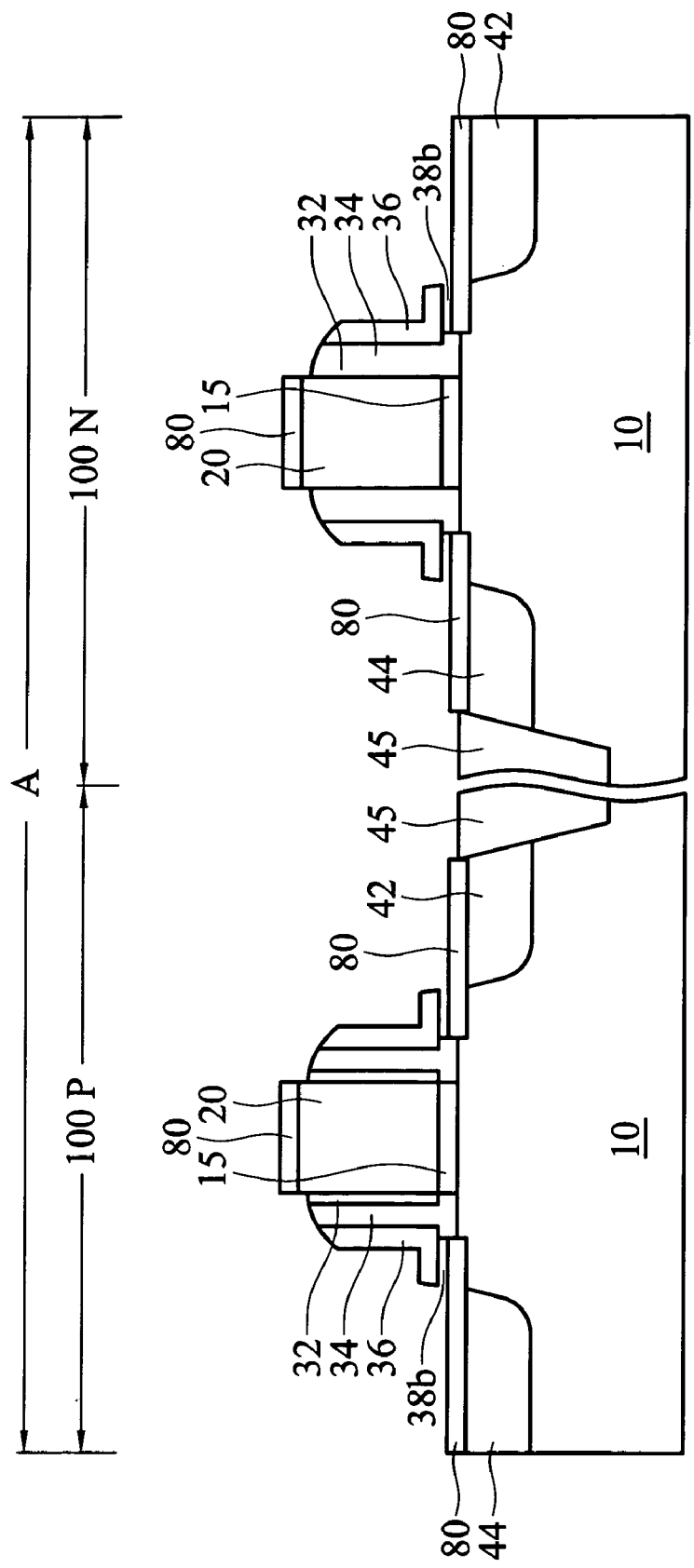
Figure 2A:
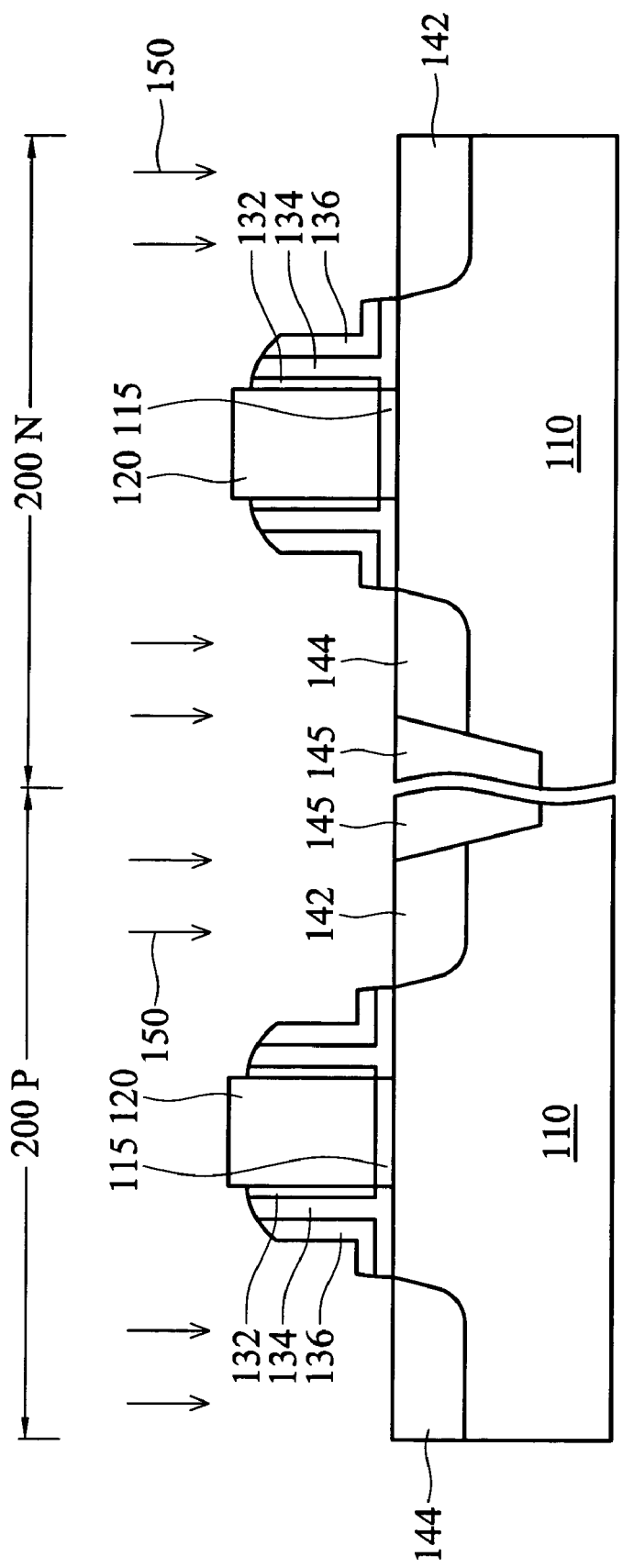
FIGS. 2A-2F are cross sections illustrating fabrication of an exemplary embodiment of the semiconductor device with selective stress memory effect of the invention.

FIGS. 2A-2F are cross sections illustrating fabrication of an exemplary embodiment of the semiconductor device with selective stress memory effect. In FIG. 2A, a semiconductor substrate 110 is provided. Substrate 110 comprises a bulk silicon substrate or a silicon-on-insulator (SOI) substructure. The substrate 110 can preferably comprise a monocrystalline silicon substrate doped p-well for an NMOS device 200N or an n-well for a PMOS device 200P. For example, a CMOS transistor includes a PMOS transistor 200P, typically formed in an n-well (not shown), and an NMOS transistor 200N formed in a p-well (not shown). The substrate 110 has a first well of the first conductivity type and a second well of the second conductivity type. The first well and the second well are isolated from one another by shallow trench isolation (STI) 145 in the substrate 110 to separate PMOS transistor 100P from NMOS transistor 100N. Gate dielectric 115 is deposited on the surface of the semiconductor substrate 110 over both the PMOS transistor 200P and the NMOS transistor 200N. Gate electrode 120 such as doped silicon is deposited and formed on gate dielectric 115 over both the PMOS transistor 200P and the NMOS transistor 200N. Insulating sidewall spacers such as oxide-nitride-oxide (ONO) structures 132, 134, and 136 are formed on the sidewalls of the gate electrode 120 over both the PMOS transistor 200P and the NMOS transistor 200N. Ion implantation 150 is performed to create source 144 and drain 142 in the substrate 110. The source 144 and drain 142 over the PMOS transistor 200P are inverted doping types corresponding to those over the NMOS transistor 200N. The PMOS transistor 200P and NMOS transistor 200N can alternatively include a lightly doped drain (LDD) formed prior to forming sidewall structures 132, 134, and 136 and subsequently implanting a heavily doped impurity distribution to form source/drain implants as will be familiar to those skilled in the field of semiconductor processing.

Figure 2B:
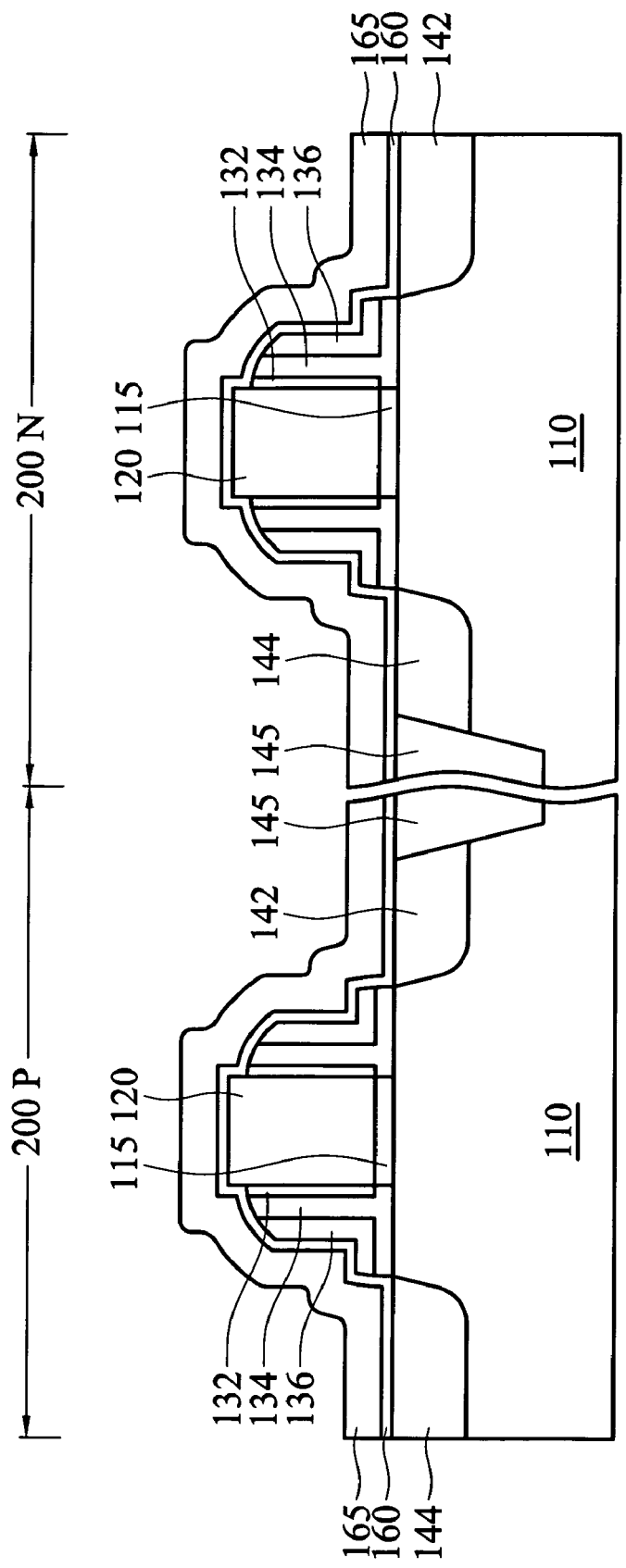

Referring to FIG. 2B, a first dielectric layer 160 and a second dielectric layer 165 are sequentially formed on the substrate over both the PMOS transistor 200P and the NMOS transistor 200N. For example, the first dielectric layer 160 can be a low pressure chemical vapor deposition (LP CVD) formed TEOS layer at about 30-200 Å, preferably at 80 Å. The second dielectric layer 165 can be a low pressure chemical vapor deposition (LP CVD) formed silicon nitride layer at about 100-500 Å, preferably 250 Å. The second dielectric layer 165 is 2~17 times thicker than the first dielectric layer 160.

Figure 2C:
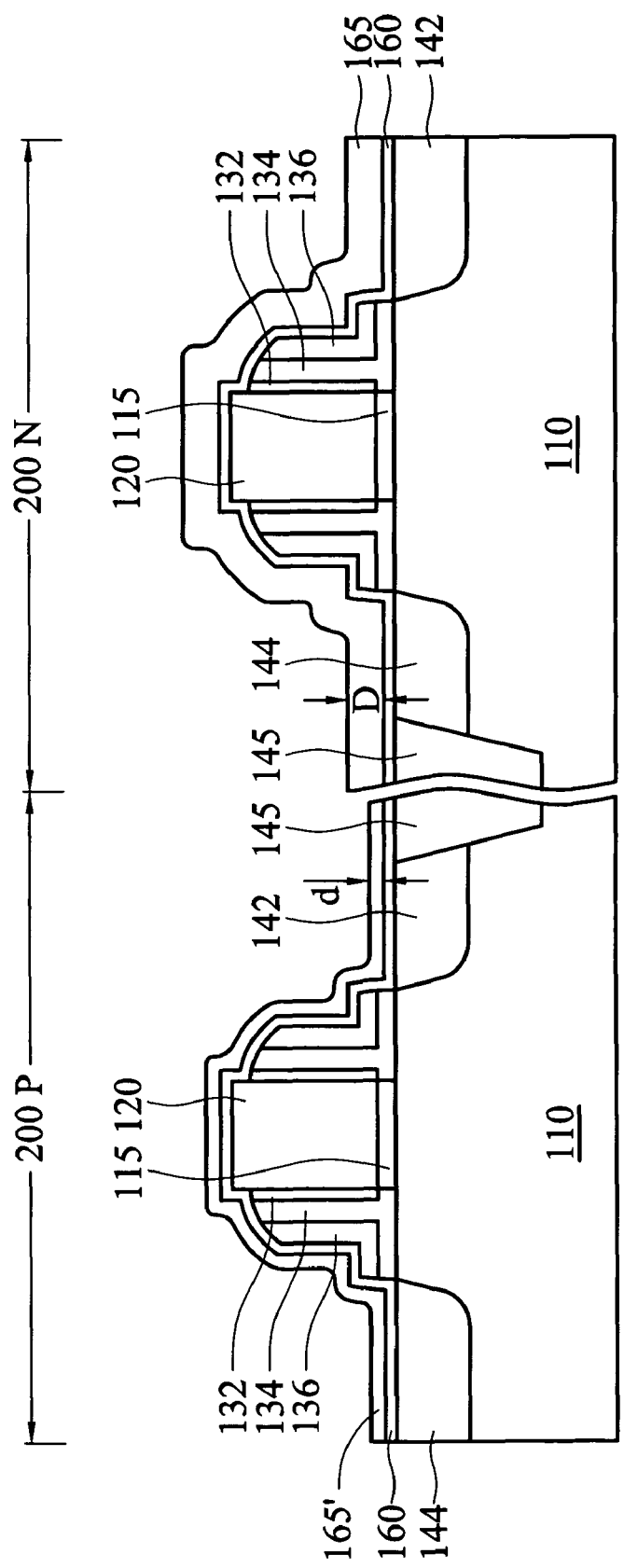

Referring to FIG. 2C, a mask (not shown) is disposed over the NMOS transistor 200N, thereby exposing the second dielectric layer 165 over the PMOS transistor 200P. An etching process is performed to thin the exposed second dielectric layer 165. The thinned second dielectric layer 165' over the PMOS transistor 200P preferably has a thickness d1 of about less than 500 Å, preferably less than 100 Å, while the second dielectric layer 165 over the NMOS transistor 200N preferably has a thickness d2 of about 100-500 Å, preferably 250 Å). The thickness d2 of the silicon nitride layer on the NMOS transistor 200N is about 13 times the thickness d1 of the second silicon nitride layer on the PMOS transistor 200P. Therefore, different stresses are selectively generated over either the PMOS transistor 200P or the NMOS transistor 200N. In order to induce stress over both the PMOS transistor 200P and the NMOS transistor 200N selectively, the semiconductor substrate is rapid thermal annealed (RTA) at about 1000~1100° C., preferably about 1030° C.-1040° C.

Some semiconductor devices comprise a main region for a memory matrix and a peripheral region for logic control. The peripheral logic region requires silicidation to reduce contact resistance, while the main region does not require silicidation. A mask (not shown) such as a photoresist mask is disposed over the main region.

Figure 2D:
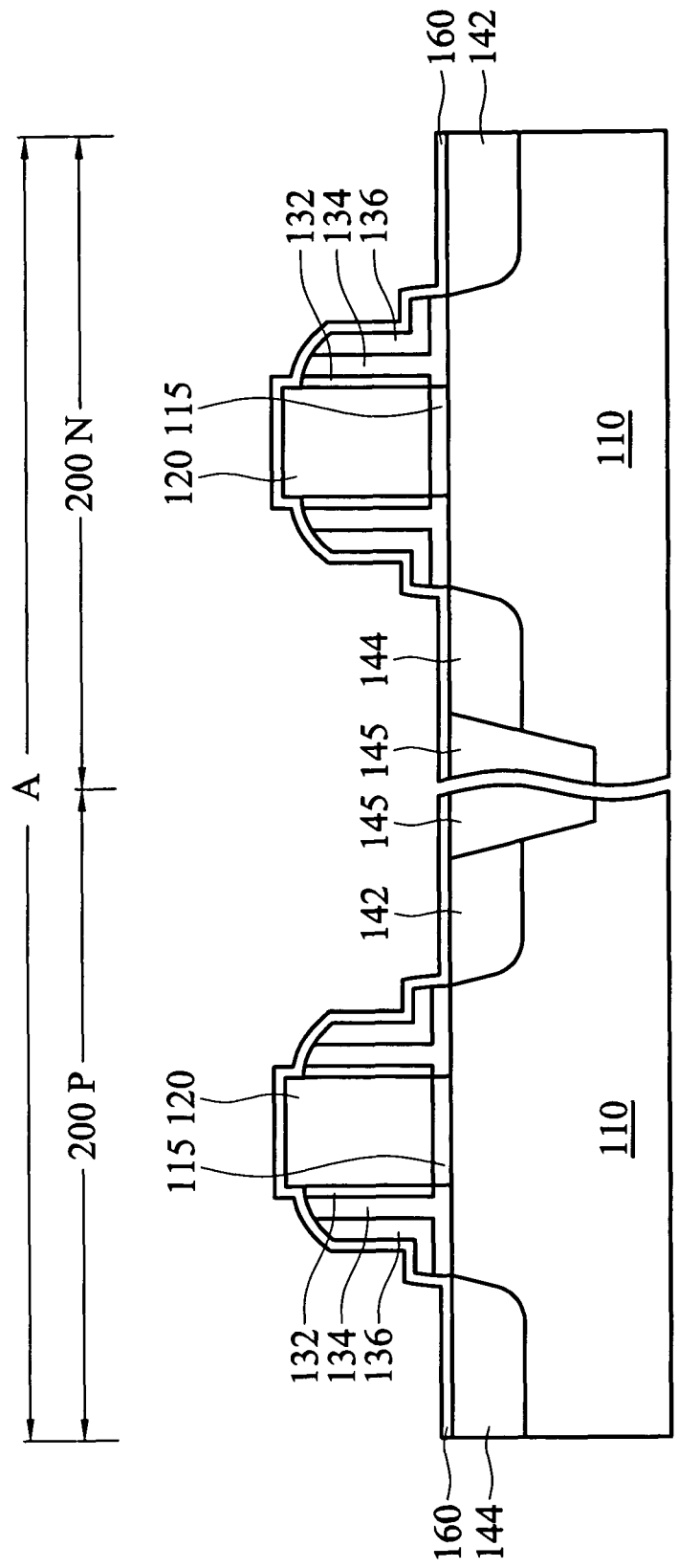
Figure 2E:
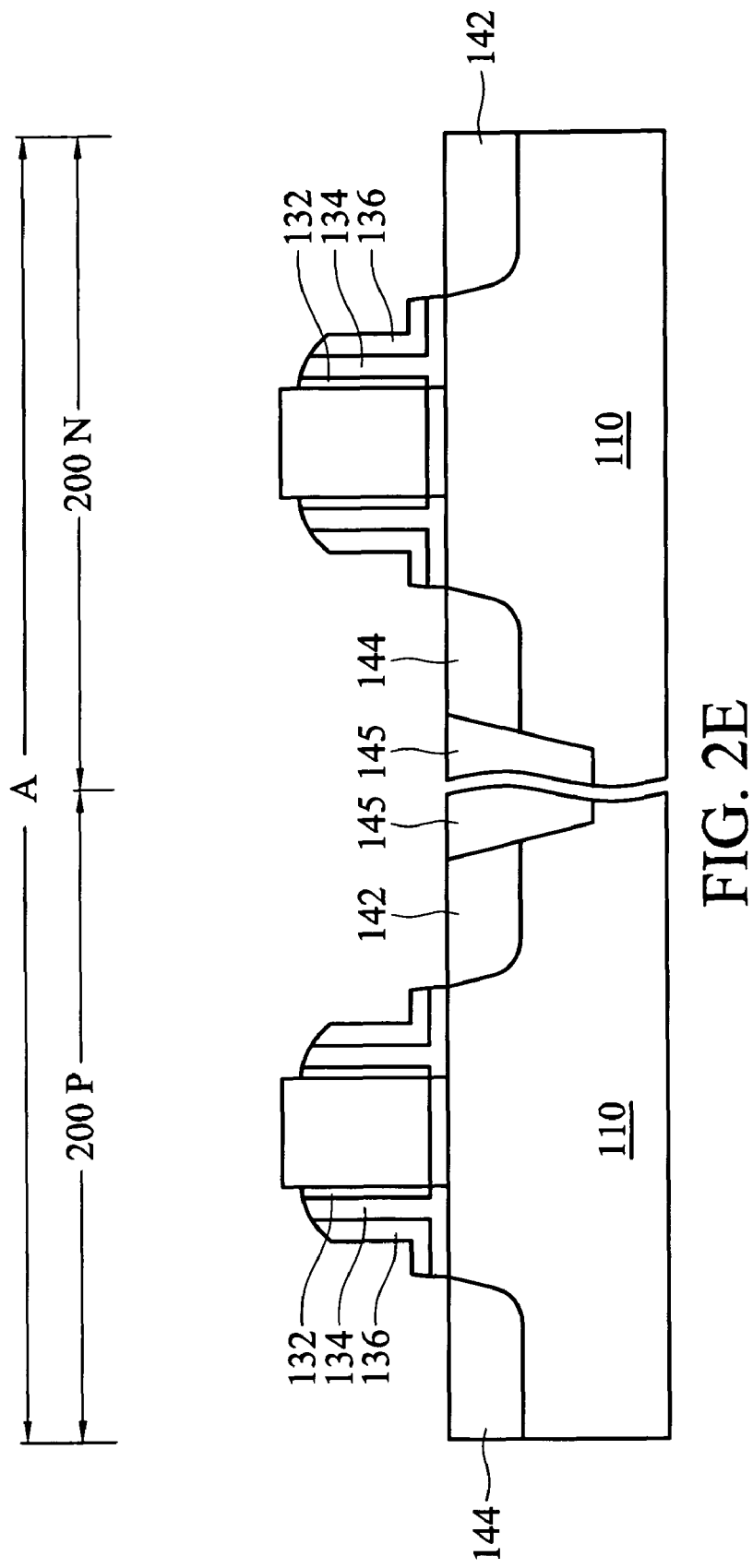

Referring to FIG. 2D, the second dielectric layer 165 over the peripheral logic region is removed by wet etching or dry etching. For example, the exposed second dielectric layer 165 is etched by hot phosphoric acid solution. The first dielectric layer 160 over the peripheral logic region is sequentially removed by wet etching. For example, the first dielectric layer 160 is etched by buffer oxide etching (BOE) solution or by diluted HF (DHF) solution, as shown in FIG. 2E. The mask (not shown) disposed over the main region is removed. Since the capped layers over the main region are protected by a mask, the thinned second dielectric layer 165' and the second dielectric layer 165 are preserved respectively over the PMOS transistor 200P and the NMOS transistor 200N over the main region. The structure of the main region is referred to FIG. 2C.

Figure 2F:
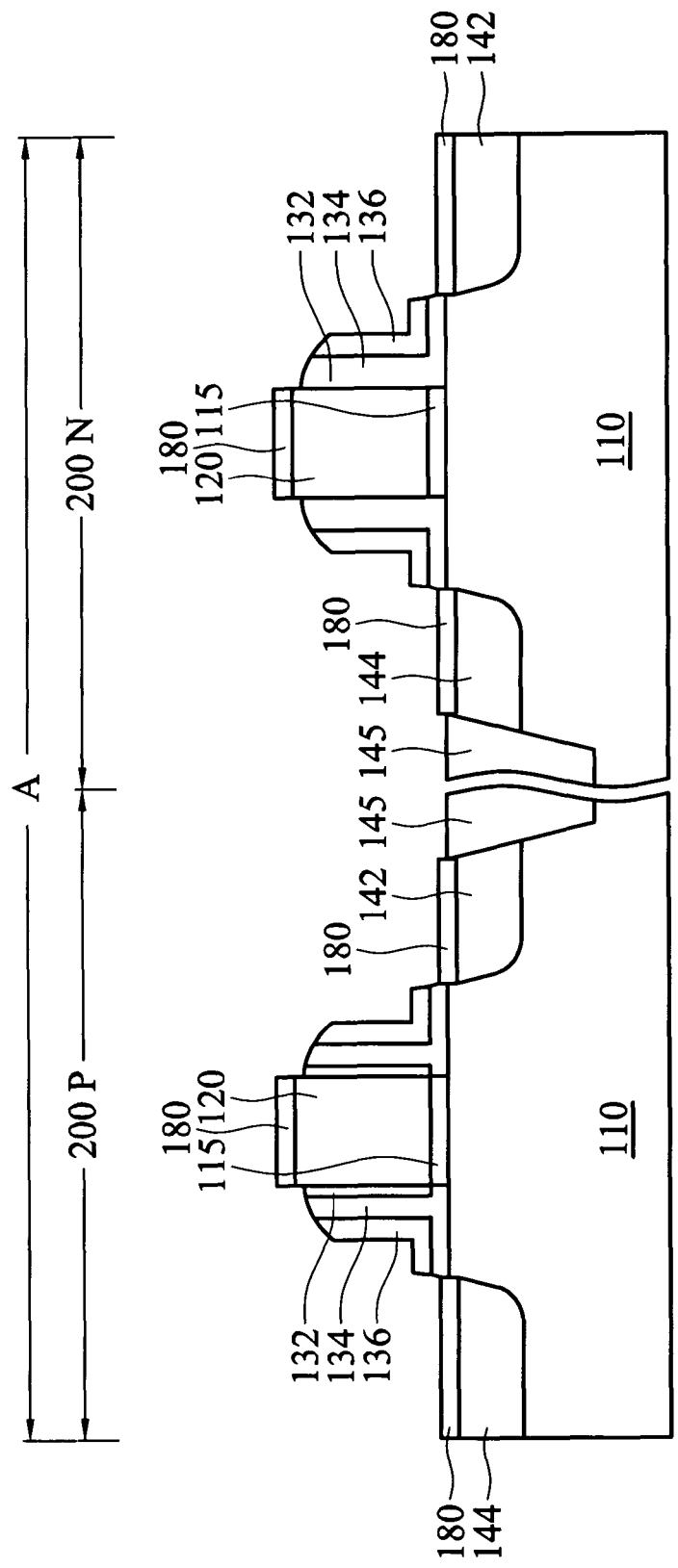

Referring to FIG. 2F, a metal layer is formed over both the PMOS transistor 200P and the NMOS transistor 200N of the main region. The metal layer directly contacts the gate electrode 120 and source and drain region 132, 134. The metal layer, such as titanium, cobalt, or nickel, is next deposited via RF sputtering or physical vapor deposition (PVD) procedures. An annealing cycle, performed using conventional furnace procedures or using a rapid thermal annealing procedure, at a temperature between about 250 to 900° C., is employed to form metal silicide layer 180, such as titanium silicide, cobalt silicide, or nickel silicide, on the exposed polysilicon or silicon surfaces on the peripheral logic circuit region. The unreacted metal is then removed using a solution comprising $H_2SO_4$—$H_2O_2$—$NH_4OH$, resulting in the desired performance enhancement as shown in FIG. 2F and the fully non-silicidized PMOS and NMOS transistors over the main region, as shown in FIG. 2C, which results in reduced leakage current. There are additional steps not mentioned here, which are required to complete the semiconductor device with selective stress memory effect thereon, but which are not essential to an understanding of the present invention.

The invention is advantageous in that a resist protective oxide (RPO) process required by conventional SMT or SSMT methods is omitted, thus manufacturing cost can be reduced and device performance improved. The STI divot and spacer undercut con be prevented due to omitted wet etching process.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a semiconductor device with selective stress memory effect thereon, comprising:
   providing a semiconductor substrate with a first device region and a second device region, both the first device region and the second device region having a first doped region and a second doped region separated by an insulation;
   forming a PMOS transistor and an NMOS transistor on both the first and second device regions respectively, the PMOS transistor having an oxide-nitride-oxide (ONO) structure on sidewalls of a gate electrode on the first doped region and the NMOS transistor having an oxide-nitride-oxide (ONO) structure on sidewalls of a gate electrode on the second doped region;
   forming a silicon oxide layer covering the NMOS transistor and the PMOS transistor on both the first and second device regions;
   forming a silicon nitride layer on the silicon oxide layer on both the first and second device regions;
   thinning part of the silicon nitride layer overlying the PMOS transistor on both the first and second device regions such that the silicon nitride layer on the NMOS transistor is thicker than that on the PMOS transistor, thereby causing the selective stress memory effect on the NMOS and PMOS transistors respectively;
   removing the silicon oxide layer and the silicon nitride layer over the second device region, while retaining the silicon oxide layer and the silicon nitride layer over the first device region; and
   silicidizing the PMOS transistor and the NMOS transistor over the second device region.

2. The method according to claim 1, wherein the first device region comprises a memory array region.

3. The method according to claim 1, wherein the second device region comprises a peripheral logic region.

4. The method according to claim 1, wherein the thickness of the silicon oxide layer is about 100 Å.

5. The method according to claim 1, wherein the thickness of the silicon nitride layer overlying the NMOS transistor is about 1~3 times the thickness of the silicon nitride layer overlying the PMOS transistor.

6. The method according to claim 5, wherein the thickness of the silicon nitride layer overlying the NMOS transistor is about 250 Å, and the thickness of the thinned silicon nitride layer overlying the PMOS transistor is about 100 Å.

7. A method for fabricating a semiconductor device with selective stress memory effect thereon, comprising:
   providing a semiconductor substrate with a first device region and a second device region, both the first device region and the second device region having a first doped region and a second doped region separated by an insulation;
   forming a PMOS transistor and an NMOS transistor on both the first and second device regions respectively, the PMOS transistor having an oxide-nitride-oxide (ONO) structure on sidewalls of a gate electrode on the first doped region and the NMOS transistor having an oxide-nitride-oxide (ONO) structure on sidewalls of a gate electrode on the second doped region;
   forming a silicon oxide layer covering the NMOS transistor and the PMOS transistor over both the first and the second device regions;
   forming a silicon nitride layer on the silicon oxide layer on both the first and second device regions;
   thinning part of the silicon nitride layer overlying the PMOS transistor over both the first and the second device regions such that the silicon nitride layer on the NMOS transistor is thicker than that on the PMOS transistor, thereby causing the selective stress memory effect on the NMOS and PMOS transistors respectively;
   annealing the semiconductor substrate, thereby inducing different stress on the PMOS transistor and the NMOS transistor respectively;
   removing the silicon oxide layer and the silicon nitride layer over the second device region, while retaining the silicon oxide layer and the silicon nitride layer over the first device region; and
   silicidizing the PMOS transistor and the NMOS transistor over the second device region.

8. The method according to claim 7, wherein the first device region comprises a memory array region.

9. The method according to claim 7, wherein the second device region comprises a peripheral logic region.

10. The method according to claim 7, wherein the thickness of the silicon oxide layer is about 100 Å.

11. The method according to claim 7, wherein the thickness of the silicon nitride layer overlying the NMOS transistor is about 250 Å.

12. The method according to claim 7, wherein the thickness of the thinned silicon nitride layer overlying the PMOS transistor is about 100 Å.

* * * * *